(12) United States Patent  
Park

(10) Patent No.: US 6,512,220 B1  
(45) Date of Patent: Jan. 28, 2003

(54) SEMICONDUCTOR IMAGE SENSOR INCORPORATING THEREIN OPTICAL LAYER

(75) Inventor: Ki-Nam Park, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 280 days.

(21) Appl. No.: 09/604,771

(22) Filed: Jun. 28, 2000

(30) Foreign Application Priority Data

Jun. 28, 1999 (KR) ............................................. 99-24950

(51) Int. Cl.[7] .............................................. H01L 27/00
(52) U.S. Cl. .................................. 250/208.1; 250/208.2
(58) Field of Search .......................... 250/208.1, 208.2, 250/216, 214 R

(56) References Cited

U.S. PATENT DOCUMENTS 5,629,517 A    5/1997    Jackson et al.
5,648,653 A    7/1997    Sakamoto et al.
5,672,519 A    9/1997    Song et al.

FOREIGN PATENT DOCUMENTS

| JP | 63-168048 | 7/1988 | ........... H01L/27/14 |
| JP | 63-182854 | 7/1988 | ........... H01L/27/14 |
| JP | 63-185059 | 7/1988 | ........... H01L/27/14 |
| JP | 64-73728 | 3/1989 | ......... H01L/21/314 |
| JP | 3-270074 | 12/1991 | ........... H01L/29/46 |
| JP | 4-113674 | 4/1992 | ......... H01L/27/148 |
| JP | 08125156 | 5/1996 | ......... H01L/27/146 |
| JP | 10-288550 | 10/1998 | ............. G01J/1/02 |
| KR | 10-1999-0024950 | 10/1999 | |

*Primary Examiner*—Hung Xuan Dang
(74) *Attorney, Agent, or Firm*—Jacobson Holman PLLC

(57) ABSTRACT

A semiconductor image sensor for detecting a light incident thereto, includes a semiconductor substrate divided into a light sensing region and a peripheral circuit region, a photodiode formed on top of the light sensing region, at least one transistor formed on top of the peripheral circuit region, at least one insulating layer formed on top of the photodiode and the transistor; and an optical layer formed on the insulating layer to efficiently transmit the light to the photodiode.

12 Claims, 3 Drawing Sheets

SEMICONDUCTOR IMAGE SENSOR INCORPORATING THEREIN OPTICAL LAYER

FIELD OF THE INVENTION

The present invention relates to an image sensor; and, more particularly, to a CMOS image sensor incorporating therein an optical layer for improving an optical efficiency thereof.

DESCRIPTION OF THE PRIOR ART

As is well known, an image sensor is an apparatus for receiving light, i.e., photons, reflected from an object and generating a digital image data. Especially, an image sensor made by a CMOS (complementary metal oxide semiconductor) fabrication technology is called a CMOS image sensor.

In FIG. 1, there is shown a cross-sectional view of a unit pixel contained in a conventional CMOS image sensor.

Generally, a unit pixel contained in the conventional CMOS image sensor is divided by a light sensing region 112 for accumulating photons reflected from an object and a peripheral circuit region 114 for transferring the photons to a data processing unit. A photodiode 120 is formed on top of the light sensing region 112 and transistors 130 are formed on top of the peripheral circuit region 114, to thereby provide a semiconductor structure.

For electrical isolation and electrical interconnection, a plurality of insulating layers 140, 150 and 160 and metal lines 152 and 162 are formed on the semiconductor structure. Then, a passivation layer 170 is formed on the uppermost insulating layer 160 in order to protect the unit pixel from an exterior.

However, the passivation layer and the insulating layers have been formed with consideration of electrical characteristic and device reliability rather than that of optical transmittance characteristic. As a result, an optical transmittance may be degraded due to a reflectance of the passivation layer and the insulating layers, thereby reducing sensitivity.

SUMMARY OF THE INVENTION

It is, therefore, an object of the present invention to provide a CMOS image sensor incorporating therein an optical layer for improving an optical efficiency thereof.

In accordance with an aspect of the present invention, there is provided a semiconductor image sensor for detecting a light incident thereto, comprising: a semiconductor substrate divided into a light sensing region and a peripheral circuit region; a photodiode formed on top of the light sensing region; at least one transistor formed on top of the peripheral circuit region; at least one insulating layer formed on top of the photodiode and the transistor; and an optical layer formed on the insulating layer to efficiently transmit the light to the photodiode.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
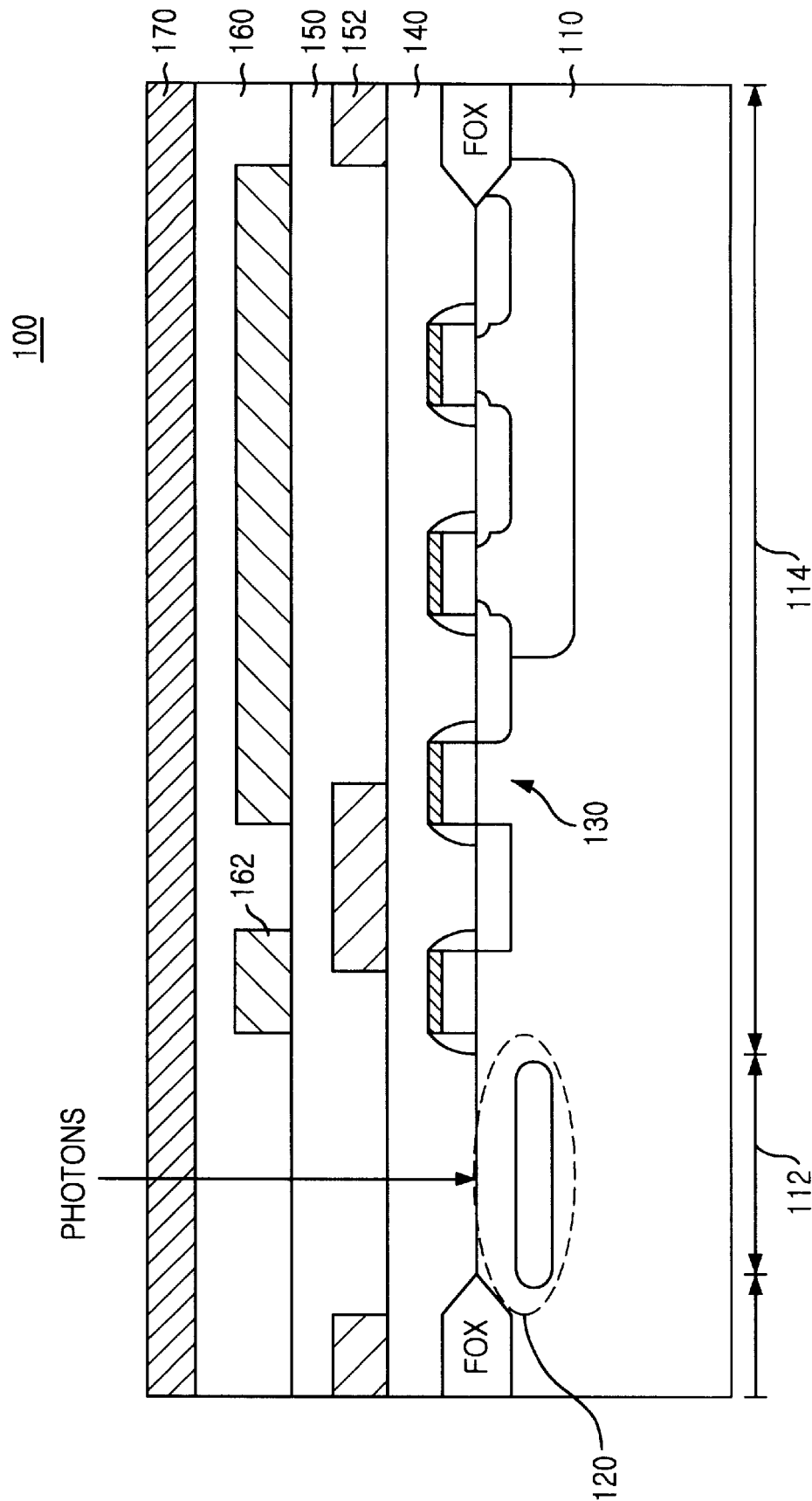
FIG. 1 is a cross-sectional view showing a unit pixel contained in a conventional CMOS image sensor.
Figure 2:
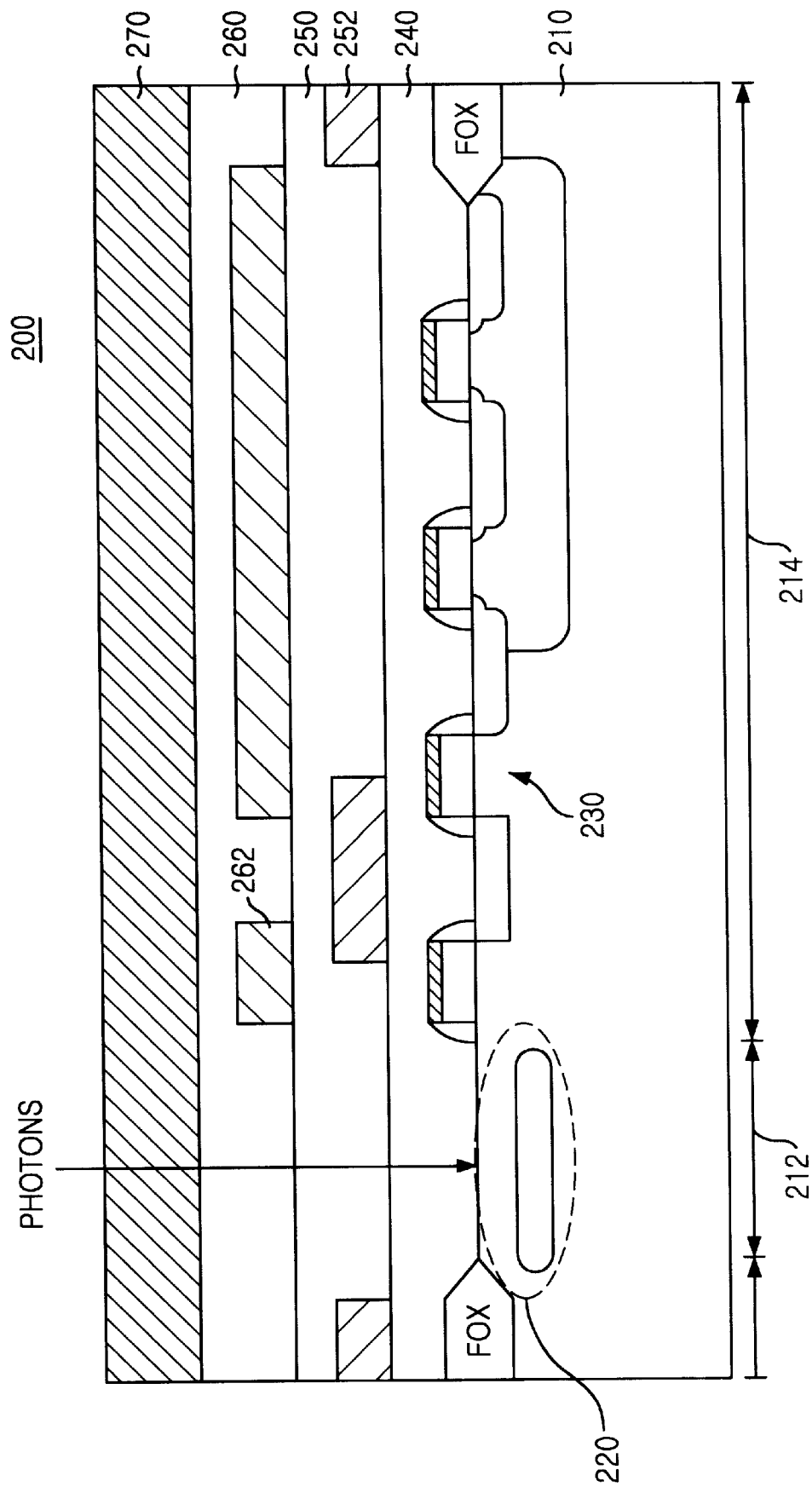
FIG. 2 is a cross-sectional view illustrating a unit pixel incorporating therein an optical layer as an embodiment of the present invention.

FIG. 2 is a cross-sectional view illustrating a unit pixel 200 contained in a CMOS image sensor as an embodiment of the present invention.

Referring to FIG. 2, a photodiode 220 and a plurality of transistors 230 are formed on a semiconductor substrate 210 in a light sensing region 212 and a peripheral circuit region 214, respectively, to provide a semiconductor structure.

A first insulating layer 240 is formed on the semiconductor structure. First metal lines 252, a second insulating layer 250, second metal lines 262, and a third insulating layer 260 are sequentially formed on the first insulating layer 240.

Next, an optically designed insulating layer (hereinafter, referred to as optical layer) 270 is formed on the uppermost insulating layer 260.

At this time, the optical layer 270 can be made of a silicon and oxygen containing layer, e.g., $SiO_2$. Additionally, the optical layer 270 is formed with a tetra-ethoxy-ortho-silicate (TEOS) by performing a plasma-enhanced chemical vapor deposition (PECVD).

Furthermore, the optical layer 270 is formed to a predetermined thickness corresponding to a quarter-wave optical thickness (hereinafter, referred to as QWOT). The QWOT is defined by an equation 1.

$$t_{OL} = \frac{(2N-1) \times \lambda}{4 \times n_{OL}} \quad \text{(Eq. 1)}$$

where, $t_{OL}$ is a thickness of the optical layer,

N is a positive integer, $n_{OL}$ is a refractive index of the optical layer, and $\lambda$ is a wavelength of a light incident.

In the above equation, the optical layer 270 is formed to have a refractive index corresponding to root times as much as a refractive index of the uppermost insulating layer 260.

Although the unit pixel 200 including three insulating layers is described above, it is preferable to form the insulting layer with only one layer or multi-layers.

As a result, the optical layer serves as a layer for preventing an optical reflectance, thereby obtaining a high optical transmittance.

Figure 3:
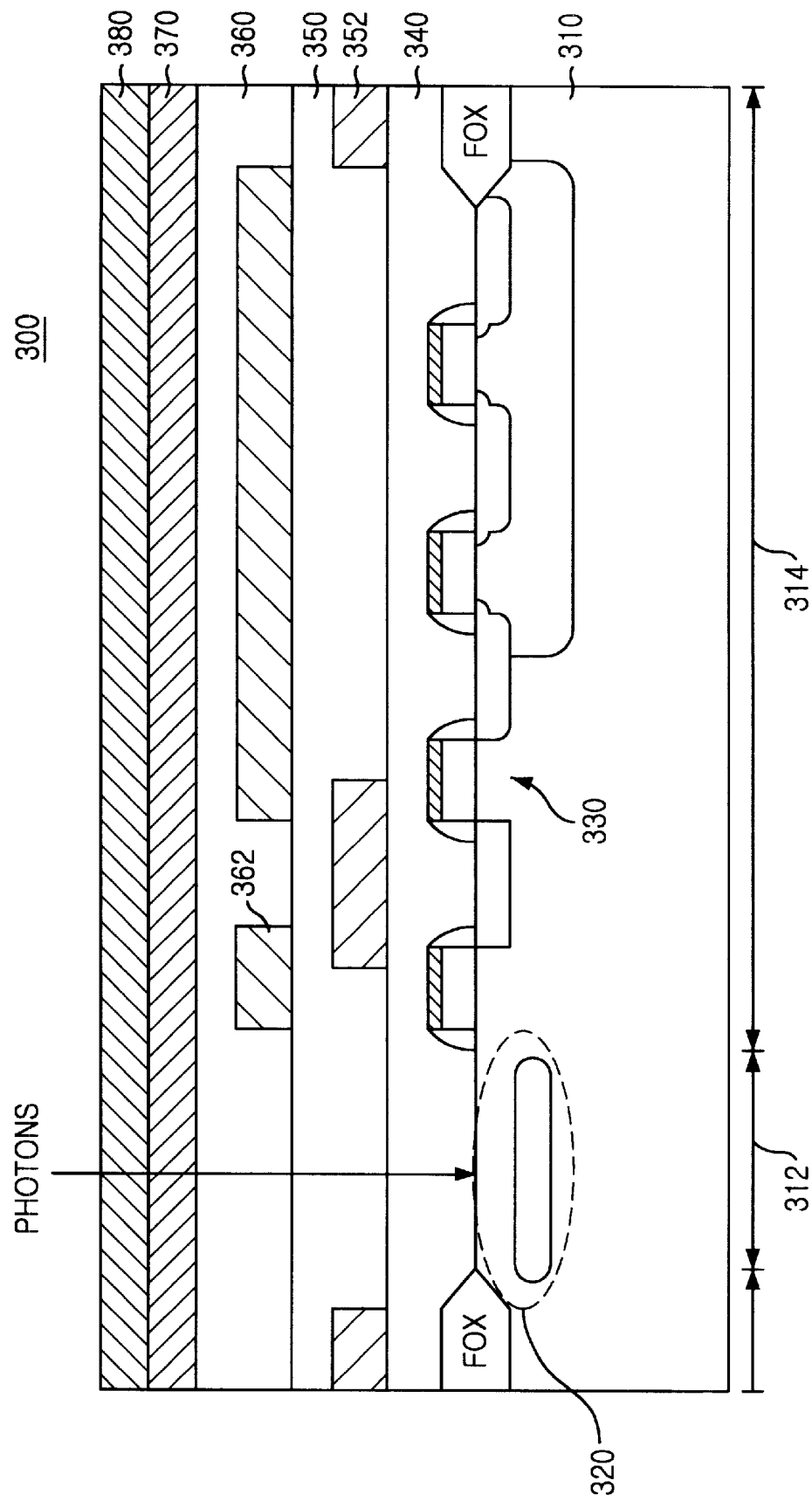
FIG. 3 is a diagram illustrating a structure of a unit pixel incorporating therein an optical layer as another embodiment of the present invention.

FIG. 3 is a cross-sectional view illustrating a unit pixel 300 in accordance with another embodiment of the present invention.

Compared with FIG. 2, only difference is that a passivation layer 370 is added between the optical layer 380 and the uppermost insulating layer 360. That is, the passivation layer 370 is formed on the uppermost insulating layer 360, and the optical layer 380 is formed on the passivation layer 370. The passivation is a kind of layer for protecting the semiconductor device from an external damage such as moisture.

The passivation layer 370 can be made of a silicon and nitrogen containing layers, e.g., $Si_3N_4$.

The optical layer 370 can be made of a silicon and oxygen containing layer, e.g., $SiO_2$. Additionally, the optical layer 370 is formed with an etra-ethoxy-ortho-silicate (TEOS) by performing a plasma-enhanced chemical vapor deposition (PECVD).

Furthermore, the optical layer 370 is formed to a predetermined thickness corresponding to the QWOT according to the equation 1.

In the equation 1, the optical layer 370 is formed to have a refractive index corresponding to root times as much as a refractive index of the passivation layer 360.

Compared with the conventional unit pixel, the optical transmittance and optical sensitivity, especially in the blue band, is remarkably improved. That is, simply by forming the optical layer on the structure of the conventional unit pixel, the CMOS image sensor can obtain an improved optical transmittance and optical sensitivity, thereby improving a picture quality and a performance thereof.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor image sensor for detecting a light incident thereto, comprising:
    a semiconductor substrate divided into a light sensing region and a peripheral circuit region;
    a photodiode formed on top of the light sensing region;
    at least one transistor formed on top of the peripheral circuit region;
    at least one insulating layer formed on top of the photodiode and the transistor; and
    an optical layer formed on the insulating layer to efficiently transmit the light to the photodiode, wherein a thickness ($t_{OL}$) of the optical layer is determined by as follows:

$$t_{OL} = \frac{(2N-1) \times \lambda}{4 \times n_{OL}}$$

where, $n_{OL}$, N and $\lambda$ represent a refractive index of the optical layer, a positive integer, and a wavelength of the light incident, respectively, wherein the refractive index of the optical layer corresponds to root times as much as a refractive index of the insulating layer.

2. The semiconductor image sensor as recited in claim 1, wherein the optical layer is a silicon and oxygen containing layer.

3. The semiconductor image sensor as recited in claim 1, wherein the optical layer is a tetra-ethoxy-ortho-silicate (TEOS) layer.

4. The semiconductor image sensor as recited in claim 3, wherein the tetra-ethoxy-ortho-silicate (TEOS) layer is formed by using a plasma enhanced chemical vapor deposition (PECVD).

5. The semiconductor image sensor as recited in claim 4, wherein a plurality of metal lines is embedded into the insulating layer formed in the peripheral circuit region to electrically connect the photodiode with the transistors.

6. The semiconductor image sensor as recited in claim 4, wherein a plurality of metal lines is embedded into the insulating layer formed in the peripheral circuit region to electrically connect the photodiode with the transistors.

7. The semiconductor image sensor as recited in claim 3, wherein the tetra-ethoxy-ortho-silicate (TEOS) layer is formed by using a plasma enhanced chemical vapor deposition (PECVD).

8. The semiconductor image sensor as recited in claim 1, further comprising a passivation layer formed between the insulating layer and the optical layer, for protecting the image sensor from an external influence.

9. The semiconductor image sensor as recited in claim 8, wherein the passivation layer is made of a silicon and nitrogen containing layer.

10. The semiconductor image sensor as recited in claim 9, wherein a thickness ($t_{OL}$) of the optical layer is determined by as follows:

$$t_{OL} = \frac{(2N-1) \times \lambda}{4 \times n_{OL}}$$

where, $n_{OL}$, N and $\lambda$ represent a refractive index of the optical layer, a positive integer, and a wavelength of the light incident, wherein the refractive index of the optical layer corresponds to root times as much as a refractive index of the passivation layer.

11. The semiconductor image sensor as recited in claim 10, wherein the optical layer is a silicon and oxygen containing layer.

12. The semiconductor image sensor as recited in claim 11, wherein the optical layer is a tetra-ethoxy-ortho-silicate (TEOS) layer.

* * * * *